United States Patent [19]
Doner

[11] Patent Number: 5,705,987
[45] Date of Patent: Jan. 6, 1998

[54] CIRCUIT FOR CONTROLLING OPERATION OF A LOAD AFTER A PREDETERMINED TIME DELAY

[75] Inventor: Thomas Doner, Poplar Grove, Ill.

[73] Assignee: AGF Manufacturing, Inc., Warren, N.J.

[21] Appl. No.: 589,389

[22] Filed: Jan. 22, 1996

[51] Int. Cl.$^6$ .................................................. G08B 21/00
[52] U.S. Cl. ........................ 340/606; 327/457; 340/530
[58] Field of Search ........................ 340/606, 529, 340/530; 327/455, 457; 361/198

[56] References Cited

U.S. PATENT DOCUMENTS

| | | | |
|---|---|---|---|
| 3,176,284 | 3/1965 | Jones et al. | 340/530 |
| 3,597,632 | 8/1971 | Vandemore et al. | 327/393 |
| 3,623,088 | 11/1971 | Peterson | 340/529 |
| 3,688,130 | 8/1972 | Granieri | 327/449 |
| 3,713,126 | 1/1973 | Stettner | 340/527 |
| 3,715,623 | 2/1973 | Szabo | 327/457 |
| 3,740,585 | 6/1973 | Squiers | 327/456 |
| 3,742,337 | 6/1973 | Digneffe | 327/457 |
| 3,745,382 | 7/1973 | Hoge et al. | 327/402 |
| 3,746,887 | 7/1973 | Lorenz | 327/455 |
| 3,749,864 | 7/1973 | Tice | 200/81.9 M |
| 3,764,832 | 10/1973 | Stettner | 327/392 |
| 3,794,858 | 2/1974 | Squiers | 327/143 |
| 3,846,648 | 11/1974 | Scott | 327/392 |
| 3,940,634 | 2/1976 | Grogan | 327/451 |
| 4,103,294 | 7/1978 | Stettner et al. | 367/136 |
| 4,152,608 | 5/1979 | Nakasone et al. | 327/402 |
| 4,331,914 | 5/1982 | Huber | 327/457 |
| 4,382,192 | 5/1983 | Mendelson | 307/141.4 |
| 4,458,239 | 7/1984 | Willey et al. | 340/540 |
| 4,745,311 | 5/1988 | Iwasaki | 327/428 |
| 4,791,254 | 12/1988 | Polverari | 200/81.9 M |
| 5,036,234 | 7/1991 | Friedrich et al. | 327/457 |
| 5,323,062 | 6/1994 | Crawford et al. | 327/455 |

*Primary Examiner*—Jeffery Hofsass
*Assistant Examiner*—John Tweel, Jr.
*Attorney, Agent, or Firm*—Burns, Doane, Swecker & Mathis, L.L.P.

[57] ABSTRACT

A circuit for controlling operation of a load, such as an alarm circuit in a fire protection system, in which operation of the load is delayed for an adjustable time period. The load control circuit includes a DIAC for generating a first trigger signal, an SCR which generates a second trigger signal, and a switch, preferably a TRIAC, which provides a supply voltage to the load upon receipt of the second trigger signal. A variable resistor is provided to adjust the time required to generate the first trigger signal.

39 Claims, 3 Drawing Sheets

CIRCUIT FOR CONTROLLING OPERATION OF A LOAD AFTER A PREDETERMINED TIME DELAY

BACKGROUND OF THE INVENTION

The present invention is directed toward a time delay circuit for controlling operation of a load and is more particularly directed toward a time delay circuit for controlling the activation of an alarm circuit in a fire protection system.

Because it is sometimes desirable to delay the application of a voltage or current to an electrical load, numerous load control circuits have been developed. Examples of such circuits are disclosed in U.S. Pat. No. 3,745,382 to Hoge et al., U.S. Pat. No. 3,597,632 to Vandemore, and U.S. Pat. No. 3,764,832 to Stettner. However, these and other known load control circuits are relatively complicated and have numerous components, thus increasing manufacturing difficulty and costs. Further, these and other known load control circuits typically provide relatively lengthy time delays, on the order of five minutes, and are unreliable.

Load control circuits are used in a variety of applications including, for example, to delay activation of an alarm circuit in a fire protection system. Conventional fire suppression systems typically include a source of water or other fire-extinguishing fluid, a detector for detecting the flow of the fire extinguishing fluid through a pipe or conduit, and an alarm circuit or other load that is activated when a sufficient flow is detected.

In such systems, the alarm is preferably not activated immediately upon detection of fluid flow in the conduit, because flow may occur due to a "water hammer" or fluid backwash within the system. If the alarm were activated immediately upon detection of a water flow, a large number of false alarms would result.

In order to reduce or eliminate such false alarms, a load control circuit may be used to delay the activation of the alarm for a predetermined time following detection of an alarm condition. Early load control circuits were simple mechanical devices, such as dashpots in which air was forced into and out of a chamber. The alarm would not sound until the air was completely out of the chamber, at which time a switch would close to activate the alarm.

These and other conventional time delay mechanisms were designed to provide a delay in the range of 30 seconds to 90 seconds. However, these conventional time delay devices were unreliable and inaccurate, and were thus unsuccessful in eliminating false alarms. Accordingly, solid state electrical load control circuits were developed for fire suppression systems such as the time delay circuit known as ICM/HMKS-W 1104.

These electrical load control circuits delay activation of the alarm until a solid state electrical switch is rendered conductive. However, electrical switches require a latching voltage to maintain the conductive state. Because the switch is provided across the delay circuit, the latching voltage reduces the effective voltage supplied to the load, and thus it is difficult for the switch to remain conductive while still providing sufficient power to the load.

In particular, approximately 13 to 16 volts are required to maintain the conductive state of a typical solid state switch. This causes a 13 to 16 voltage drop across the time delay circuit and reduces the power supplied to the alarm circuit or other load to about 104–107 volts. This lower voltage may be insufficient for some loads, such as horns, lights, motors, solenoids, or other components.

Accordingly, the need exists for a simple and reliable load control circuit in which the voltage drop across the circuit is reduced.

SUMMARY OF THE INVENTION

One object of the present invention is to solve the disadvantages noted above with respect to conventional load control and fire suppression systems.

It is another object of the present invention to provide a simple load control circuit which allows time delays on the order of 10 to 90 seconds and incurs only a small voltage drop.

It is another object of the present invention to provide a simple load control circuit which maximizes the power provided to the load after expiration of the desired time delay.

A load control circuit according to an exemplary embodiment of the present invention includes a supply terminal for receiving a supply voltage and a detector which detects a condition requiring the operation of a load. The detector causes a threshold voltage to be generated from the supply voltage, and a time delay controller controls the time required to generate the threshold voltage. A DIAC or equivalent element conducts to generate a first trigger signal once the threshold voltage is achieved, and a silicon-controlled rectifier (SCR) generates a second trigger signal in response to the first trigger signal. The circuit includes a TRIAC or similar switch which is rendered conductive by the second trigger signal to cause a voltage to be provided to the load. Due to the selection and arrangement of the circuit components, the voltage supplied to the load is substantially the same as the supply voltage. According to an alternate embodiment of the present invention, multiple electrically isolated loads can be separately controlled.

If the supply voltage is an AC (alternating current) voltage, the circuit also includes a rectifying diode or equivalent element for converting the AC voltage to a DC (direct current) voltage. The time delay controller may include a potentiometer (variable resistor) to vary the delay time required to generate the threshold voltage, and may also include a trim pot jumper to bypass the potentiometer and eliminate the delay time.

For implementation in a fire protection system, the detector may be a magnet operated reed switch for detecting a threshold fluid flow in a conduit and the load is an alarm for indicating the threshold flow in the pipe.

Thus, a load control circuit according to the present invention delays operation of a load for a predetermined time period and incurs only a minimal voltage drop, resulting in an increased voltage supply to the load. The circuit is simple and uses relatively few components. The load control circuit according to the invention may be used with a variety of switches, including a flow detector switch in the pipeline of a fire protection system.

BRIEF DESCRIPTION OF THE DRAWINGS

Further objects, features and advantages of the present invention will become apparent upon reading the following Detailed Description of Preferred Embodiments in conjunction with the accompanying drawings, in which like reference indicia indicate like elements, and in which.

DETAILED DESCRIPTION OF THE PREFERRED EMBODIMENTS

Figure 1:
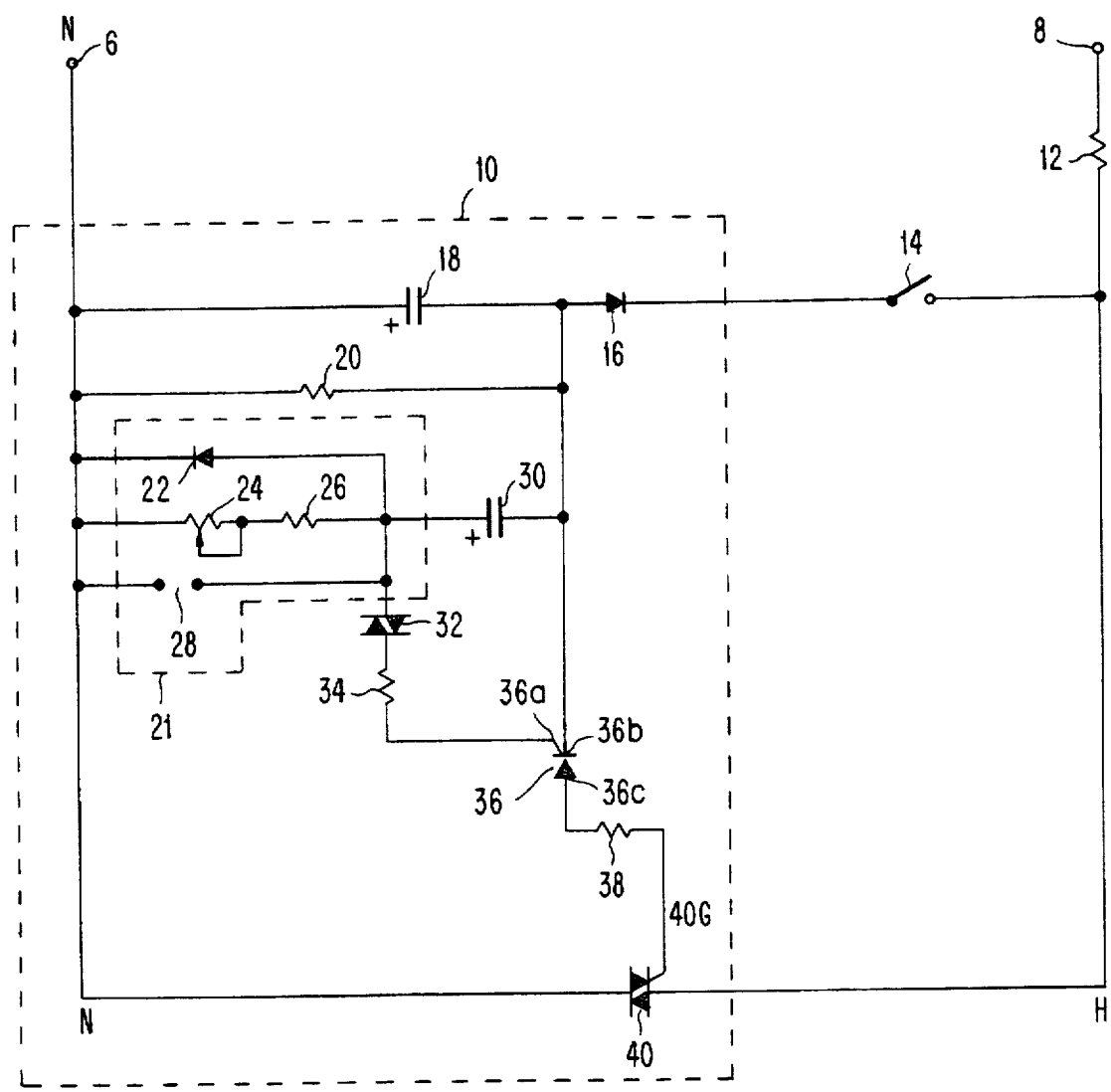
FIG. 1 is a circuit diagram illustrating a first embodiment of the present invention.

Referring to FIG. 1, a circuit according to a first embodiment of the present invention is shown, which includes a neutral terminal 6 connected to ground and a supply terminal 8 connected to a standard A.C. power source of between 30 and 120 volts at 60 Hz. A load 12 is connected to the supply terminal 8 to receive the supply voltage. A load control circuit 10 is connected between the load 12 and the neutral terminal 6 to selectively connect the load between the supply terminal 8 and the neutral terminal 6. In this embodiment, it is assumed that the load 12 draws a maximum of 6 amps; it will be readily appreciated that the circuit may be readily modified to accommodate loads having a current draw greater than 6 amps. The load control circuit 10 includes a switch 14, a diode 16, and a first capacitance 18 connected in series between the load 12 and the neutral terminal 6. In the preferred embodiment, the diode 16 is a 1N4005 diode, and the first capacitance 18 is a 20 micro farad (MFD) capacitor rated at 200 volts D.C. (VDC). It will be appreciated that other suitable diodes and other suitable charge storing elements may be used for diode 16 and first capacitance 18, respectively.

The first capacitor 18 is connected in parallel to a resistance 20. A second capacitance 30 and a time delay setting circuit 21 are connected in series, in a circuit path that is in parallel with resistance 20 and in parallel with first capacitance 18. Resistance 20 functions to discharge capacitance 18 when operation of the load control circuit is completed. Resistance 20 may be a fixed 22 kilo ohm (kΩ) resistor rated for 1 watt (W) or other suitable resistor. The second capacitance 30 may be a 47 MFD/50 VDC capacitor or other suitable charge storing element.

Time delay circuit 21 includes three parallel circuit paths connected between capacitor 30 and neutral terminal 6. The first path includes diode 22, the second path includes potentiometer 24 connected in series to a resistance 26, and the third path includes trim pot jumper 28. Time delay circuit 21 functions to adjustably control the charging rate of capacitor 30 to delay activation of the load 12. Resistance 26 is preferably a fixed resistor, for example, a 100 kΩ resistor rated for 1 watt, which functions to provide a minimum (e.g., 10 seconds) time delay for time delay circuit 21. The trim pot jumper 28 allows potentiometer 24 and resistance 26 to be bypassed to eliminate the delay function of the load control circuit. Alternatively, resistor 26 and trim pot jumper 28 may be omitted, in which case adjustment of the potentiometer 24 may cause the time delay to vary between 0 and, e.g., 90 seconds.

The input of the time delay circuit 21 is connected to a DIAC 32. The DIAC 32 is preferably a HT-32 DIAC having a trigger voltage of 32 volts, though any suitable triggering element may be used. In particular, the circuit may be modified to operate at a lower voltage level by replacing the 32 volt DIAC with a DIAC having a lower trigger voltage (e.g., 10 volts). Such a modification would be appropriate if the supply voltage was reduced below 30 volts A.C. As will be appreciated by those skilled in the art, a DIAC (DIode AC switch) is a bidirectional diode which may be rendered conductive when a "breakover" or "trigger" voltage is exceeded in either direction by an applied voltage or trigger spike. Suitable DIACs are available from numerous suppliers, including the Teccor Corporation of Dallas, Tex.

The DIAC 32 is connected to a gate 36a of a silicon controlled rectifier (SCR) 36 through a resistance 34. The resistance 34 may be a fixed 5.6 kΩ resistor rated for 0.5 watts or other suitable resistance element. SCR 36 is preferably an EC103B SCR, available from numerous manufacturers, including the Teccor Corporation of Dallas, Tex. The anode 36b of the SCR 36 is connected to the cathode of the second capacitor 30, resistance 20, and between the cathode of first capacitance 18 and the cathode of the diode 16. The cathode 36c of the SCR 36 is connected to the gate 40g of the TRIAC 40 through resistance 38. Resistance 38 may be, for example, a 1kΩ resistor rated for 1 watt or other suitable resistance element. The M2 anode of the TRIAC 40 is connected to the ground terminal 6 and the M1 anode is connected to the supply terminal 8 through the load 12. As will be appreciated by those skilled in the art, a silicon controlled rectifier (SCR) is rendered conductive when a proper signal is applied to its gate. The SCR remains conductive when the gate signal is removed, and is turned off by removing the anode voltage, reducing the anode voltage below the cathode voltage, or making the anode voltage negative, as on the alternate half-cycles of an A.C. power source. A TRIAC (TRIode AC switch) is a gate-controlled bidirectional thyristor or SCR which is rendered conductive in both directions when a proper signal is applied to its gate. TRIAC 40 is preferably a Q4006L4TRIAC available from numerous suppliers including Teccor Corporation, or another suitable A.C. switch rated for approximately 6 amps. If the load 12 draws more than 6 amps, a TRIAC having a higher current rating may be used without changing any other elements in the circuit.

The load control circuit of FIG. 1 may be used, for example, in a fire suppression system. In such an arrangement, the switch 14 may be a magnet operated reed switch on a vane type water flow detector, and the load 12 may be an alarm circuit which causes bells, horns, lights, etc., to be activated in response to a threshold fluid flow in a conduit. The load control circuit components are arranged so that no voltage is applied to any component unless the reed switch that is mounted on the vane type waterflow is in the conducting state. It will be appreciated that the circuit of the present invention may be used in connection with other types of switches or detectors and/or with other types of loads. Suitable reed switches are available from numerous suppliers, including the C.P. Clare Corporation of Chicago, Ill. and the Hammlin Corporation of Lake Mills, Wis.

Using the example of a fire suppression system, the operation of the load control circuit of the present invention will now be described. When water or fire extinguishing fluid starts to flow through the pipes of a sprinkler system in a building to prevent fire damage, a small permanent magnet in one of the pipes is brought into close contact with a glass sealed reed switch 14, causing the switch 14 to close. Examples of such switches are disclosed in U.S. Pat. Nos. 4,791,254 to Polverari and U.S. Pat. No. 3,749,864 to Tice.

The closing of the reed switch contacts applies the supply voltage potential across at the terminals 6 and 8 and thus across rectifying diode 16. In the embodiment of FIG. 1, the supply voltage is between 30 and 120 volts A.C. (alternating current).

The diode 16 rectifies the alternating current to provide a half wave rectified current equivalent to a pulsed D.C. (direct current) voltage which rapidly charges capacitance 18 to a voltage of about 170 volts D.C. (based on an input voltage of 120 volts A.C.). Diode 16 and capacitance 18 thus have the effect of converting the A.C. voltage source into a D.C. power source. It will be appreciated that if a pulsed D.C. power source is used, a rectifying function does not need to be performed, and the diode 16 is therefore unnecessary. In this case, the closing of the switch causes capacitance 18 to be rapidly charged directly by the power source.

The charge stored by capacitance 18 slowly charges the second capacitance 30 through potentiometer 24 and resistance 26, during the non-conducting half cycle of the diode 16. It will be appreciated that an RC circuit is formed by second capacitance 30, potentiometer 24, and fixed resistor 26, and that the RC time constant and thus the charge time of capacitance 30 may be adjusted by potentiometer 24. According to one embodiment of the present invention, potentiometer 24 is a trim pot and allows the delay time of time delay circuit 21 to be adjustable between about 10 seconds and about 90 seconds. A dial or other input device (such as a screw head slot, not shown) connected to the trim pot 24 may be used to adjust the resistance and thus the time delay. Diode 22 prevents the negative cycle of the AC power supply from causing the second capacitance 30 to be discharged during operation of the load 12.

If not for the presence of DIAC 32, capacitance 30 would be charged to approximately 170 volts (based on a 120 volt A.C. supply voltage). However, when the charge stored in second capacitor 30 reaches 32 volts D.C., the break over voltage of DIAC 32 is achieved, causing DIAC 32 to conduct and generate a first trigger signal. The first trigger signal is supplied to gate 36a of SCR 36 through the resistor 34 causes SCR 36 to conduct.

The TRIAC 40 is rendered conductive in response to a negative pulse generated by SCR 36. That is, the conduction of SCR 36 results in a conduction path formed by capacitor 18, neutral line 6, terminal M2 and gate 40g of TRIAC 40, resistor 38, and SCR 36. The charge stored in capacitor 18 conducts through this path to cause the gate 40g of TRIAC 40 to become negatively biased, thus causing TRIAC 40 to be rendered conductive. When the TRIAC 40 turns on, the A.C. voltage drop between terminals 6 and 8 is only about 6 volts. The signal applied to the gate of TRIAC 40 is phase controlled such that TRIAC 40 is only about 95–98% conductive. If the TRIAC were 100% conductive, the voltage drop across the TRIAC would be greater than 6 volts, and the power supplied to the load would be reduced. If the voltage drop across the TRIAC is less than about 6 volts, the TRIAC may oscillate between conductive and non-conductive states, thus impairing operation of the load control circuit. It will be appreciated that the actual voltage drop across the TRIAC is approximately 6 (1/√2)=approximately 4 volts RMS.

Because of the low voltage drop across the TRIAC, the load 12 receives a voltage substantially equal to the supply voltage potential received at terminals 6 and 8. If the supply voltage is 120 volts A.C., the load receives approximately 114 volts A.C., which is more than sufficient to operate horns, lights, motors, solenoids or any other component in the fire alarm circuit.

When the water or fire extinguishing fluid stops flowing, the reed switch opens and the capacitors 18 and 30 are discharged to ground. Capacitance 18 discharges through resistor 20 and neutral terminal 6, and capacitance 30 discharges through diode 22 and neutral terminal 6. It will be appreciated that other suitable elements may instead be used to allow the capacitances 18 and 30 to discharge. If capacitances 18 and 30 are not provided with an effective discharge path, any remaining charge stored on the capacitances will cause the delay time to be varied during a later operation of the circuit. Once capacitances 18 and 30 are discharged, the circuit is reset and ready for another load control operation.

Figure 2:
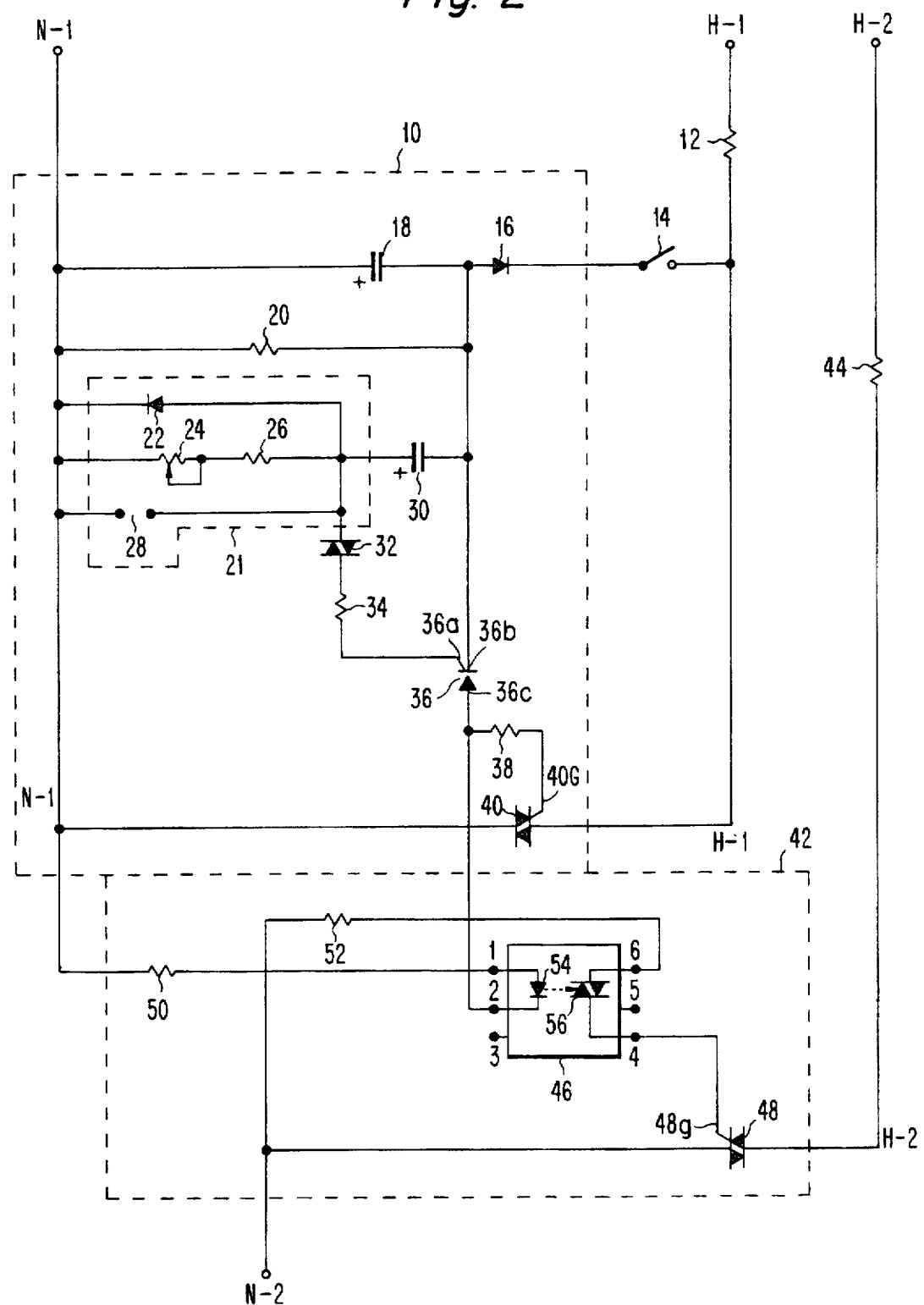
FIG. 2 is a circuit diagram illustrating a second embodiment of the present invention.

Referring now to FIG. 2, an alternate time delay circuit according to the present invention is shown. In the embodiment of FIG. 2, a voltage supply may be selectively applied after a time delay to a second load. The circuit includes a first circuit having substantially the same arrangement of components as in the embodiment of FIG. 1 connected between a first hot line H1 and a first neutral line N1, and also includes a second circuit 42 connected between second load 44 and second neutral line N2. Second circuit 42 includes opto-TRIAC 46, second TRIAC 48, and resistances 50 and 52, which are connected as shown. Second load 44 is connected to receive a second voltage supply via hot line H2. In operation, once SCR 36 is rendered conductive in the manner described above, the charge stored by first capacitance 18 is discharged to provide a negative pulse to gate 40g of TRIAC 40 and to pin 2 of opto-TRIAC 46. As a result of the discharge of first capacitance 18, TRIAC 40 is rendered conductive and a light-emitting diode (LED) 54, connected as shown between pins 1 and 2 of opto-TRIAC 46, is caused to emit light, thereby exciting an optical TRIAC 56, connected as shown between pins 4 and 6 of opto-TRIAC 46, and causing optical TRIAC 56 to conduct. The conduction of optical TRIAC 56 causes a trigger pulse to be provided to the gate 48g of second TRIAC 48, thereby rendering second TRIAC 48 conductive and causing power to be applied to second load 44. Resistances 50 and 52 are current-limiting resistors to limit the current flowing from first capacitance 18 to LED 54, and to limit current applied to gate 48g of second TRIAC 48, respectively. Resistance 50 is connected between pin 1 of opto-TRIAC 46 and first neutral line N1, and resistance 52 is connected between pin 6 of opto-TRIAC 46 and second neutral line N2.

It will be appreciated that the first and second circuits in the time delay circuit of FIG. 2 are electrically isolated from one another, and therefore enable the time delay circuit to reliably control the operation of two loads. Because the first and second circuits are electrically isolated, the voltage sources connected to hot lines H1 and H2 may provide the same or different supply voltages. Alternatively, first and second neutral lines N1 and N2 may be the same neutral line. Further, hot lines H1 and H2 may be connected to the same voltage source.

Preferably, the supply voltages provided on hot lines H1 and H2 are between approximately 30 and approximately 120 volts A.C., and first and second loads 12 and 44 draw a current of no more than approximately 6 amps. Opto-TRIAC 46 can be a 3047 opto-TRIAC available from numerous suppliers, and second TRIAC 48 can be a Q4006L4 TRIAC available from numerous suppliers. Resistances 50 and 52 can be implemented by a 690Ω resistor and 100Ω resistor, respectively. It will be appreciated that other suitable components can be used.

Further, it will also be appreciated that the addition of the second circuit 42 may require changes in the component values of the first circuit. In the preferred embodiment of the circuit of FIG. 2, first capacitance 18 is a 33 microfarad capacitor rated for 160 volts D.C. The increased capacitance compared to the circuit of FIG. 1 is desirable to provide a sufficient trigger pulse to render both TRIAC 40 and opto-TRIAC 46 conductive. Further, in the embodiment of FIG. 2, resistance 20 is preferably a 22 kΩ resistor rated for 2 watts, resistance 34 is preferably a 690Ω resistor rated for 0.5 watts, and resistance 38 is preferably a 1Ω resistor rated for 0.5 watts. Other component values remain the same. It will be appreciated that other suitable component values or components can be used for the time delay circuit of FIG. 2. It will further be appreciated that operation of more than two electrically isolated loads can be controlled according to a circuit of the type shown in FIG. 2.

Figure 3:
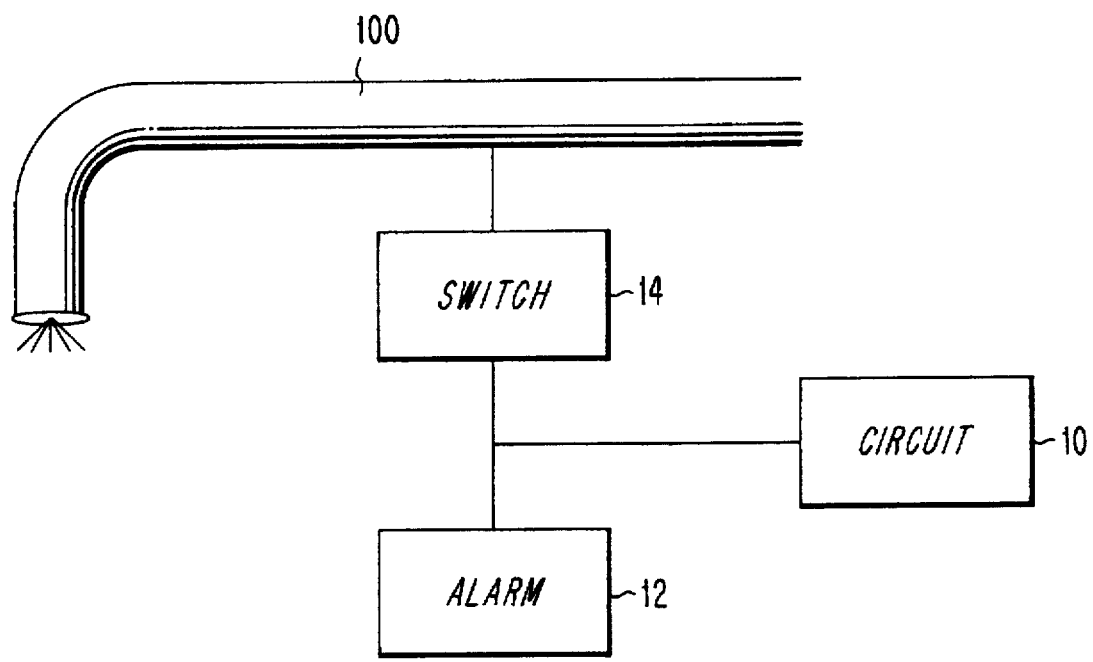
FIG. 3 is a schematic diagram of a fire protection system in which the circuit of the present invention may be implemented.

Referring now to FIG. 3, a fire suppression system including a time delay circuit 10 according to the present invention is shown.

When sufficient water flow through pipe 100 is detected by switch 14, the switch closes the circuit 10 and causes a load, e.g., an alarm or warning light, to be turned on after a desired time delay. The time delay reduces false alarms by avoiding registration of an alarm condition which might occur due to back flow or other temporary movement of water in the pipe. The delay period is selectable by the user or manufacturer as described above to accommodate a given fire protection system.

Of course, the time delay control circuit according to the present invention may be used in other applications using household or industrial current and voltage levels. For instance, the switch 14 could detect any of a number of conditions, such as gas flow, temperature (with a thermal switch), the open or closed state of an enclosure or movement of another physical object, to name but a few.

The foregoing description, while including many specificities, is intended to be illustrative of the general nature of the invention and not limiting. It will be appreciated that those skilled in the art can, by applying current knowledge, readily modify and/or adapt the specific embodiments described above for various applications without departing from the spirit and scope of the invention, as defined by the appended claims and their legal equivalents.

What is claimed is:

1. A circuit for controlling the operation of an electrical load, comprising:
   a first voltage supply for generating a first supply voltage;
   first trigger means for detecting a condition requiring operation of the load, receiving the supply voltage, and generating a first trigger signal;
   time control means for adjustably controlling the time required to generate the first trigger signal;
   second trigger means for generating a second trigger signal in response to the first trigger signal;
   switching means for providing a first load voltage to the electrical load in response to the second trigger signal, the load voltage being substantially the same as the first supply voltage;
   a second voltage supply for generating a second supply voltage; and
   second switching means for providing a second load voltage to a second electrical load in response to the second trigger signal, the second load voltage being substantially the same as the second supply voltage.

2. The circuit of claim 1, wherein the first supply voltage is an alternating current voltage and the circuit further comprises a rectifier for rectifying the alternating current voltage.

3. The circuit of claim 1, wherein the first trigger means includes a magnet operated reed switch for detecting fluid flow in a conduit, and wherein the electrical load is an alarm circuit for indicating fluid flowing in the conduit.

4. The circuit of claim 1, wherein the first trigger means includes a DIAC.

5. The circuit of claim 1, wherein the second trigger means is a silicon controlled rectifier.

6. The circuit of claim 1, wherein the switching means includes a TRIAC.

7. The circuit of claim 1, wherein the time control means includes a variable resistor.

8. The circuit of claim 1, wherein the electrical load is an alarm circuit, the first trigger means includes a reed switch, and the condition is fluid flow in a conduit.

9. The circuit of claim 1, wherein the second switching means includes an opto-TRIAC and a second TRIAC.

10. The circuit of claim 1, wherein the second switching means electrically isolates the electrical load and the second electrical load.

11. A circuit for controlling operation of an electrical load, the circuit comprising:
    a first power supply for supplying a first supply voltage;
    a trigger capacitor;
    a switch connected between the first power supply and the trigger capacitor, the switch closing to cause the trigger capacitor to be charged in response to a condition requiring operation of the electrical load;
    a trigger charge controller for controlling a delay time required to charge the trigger capacitor;
    a DIAC connected to the trigger capacitor, the DIAC generating a first trigger signal when the trigger capacitor is charged to a threshold level;
    a silicon controlled rectifier connected to the DIAC, the silicon controlled rectifier generating a second trigger signal in response to the first trigger signal;
    a first TRIAC connected to the silicon controlled rectifier, the first TRIAC conducting to supply the electrical load with a voltage substantially equal to the first supply voltage in response to the second trigger signal;
    a second power supply for supplying a second supply voltage;
    an opto-TRIAC connected to the silicon controlled rectifier the opto-TRIAC conducting to supply a third trigger signal in response to the second trigger signal; and
    a second TRIAC connected to the opto-TRIAC the second TRIAC conducting to supply a second electrical load with a substantially equal to the second supply voltage in response to the third trigger signal.

12. The circuit of claim 11, wherein the first supply voltage is an alternating current voltage, and the circuit further comprises a rectifier for rectifying the alternating current voltage in response to the condition.

13. The circuit of claim 11, wherein the electrical load is an alarm circuit.

14. The circuit of claim 11, wherein the condition is fluid flow in a conduit.

15. The circuit of claim 11, wherein the trigger charge controller includes a variable resistor for controlling the delay time between 10 and 90 seconds and further includes a trim pot jumper for bypassing the variable resistor to cause the delay time to be substantially equal to 0 seconds.

16. The circuit of claim 11, wherein the second electrical load is electrically isolated from the electrical load.

17. A detection system comprising:
    a storage element for storing a fluid, the fluid flowing in the storage element in response to a predetermined condition;
    a first electrical power supply for generating a first supply voltage;
    a threshold capacitor;
    detection means for causing the threshold capacitor to be charged by the first electrical power supply in response to fluid flow in the storage element;
    time control means for ajdustably controlling a delay time required to charge the threshold capacitor;

a first trigger element for generating a first trigger signal when the threshold capacitor is charged to a threshold level;

a second trigger element for generating a second trigger signal in response to the first trigger signal;

a first switch for causing a fist electrical load to receive a first voltage substantially equal to the first supply voltage in response to the second trigger signal;

a second electrical power supply for generating a second supply voltages;

a third trigger element for generating a third trigger signal in response to the second trigger signal; and a second switch for causing a second electrical load to receive a second voltage substantially equal to the second supply voltage in response to the third trigger signal.

18. The system of claim 17, wherein the first supply voltage is an alternating current voltage and the system further comprises a rectifier for rectifying the alternating current voltage.

19. The system of claim 17, wherein the first trigger element is a DIAC.

20. The system of claim 17, wherein the second trigger element is a silicon-controlled rectifier.

21. The system of claim 17, wherein the first switch is a TRIAC.

22. The system of claim 17, wherein the time control means includes a variable resistor which adjusts the delay time between 10 and 90 seconds.

23. The system of claim 22, wherein the time control means further includes a trim pot jumper for adjusting the time to 0 seconds.

24. The system of claim 17, wherein the detection means includes a reed switch.

25. The system of claim 17, wherein the third trigger element is an opto-TRIAC.

26. The system of claim 17, wherein the second switch is a TRIAC.

27. The system of claim 17 wherein the second electrical load is load is electrically isolated from the first electrical load.

28. A method for controlling the operation of an electrical load, comprising the steps of:

detecting a condition requiring operation of the electrical load;

providing a first supply voltage to a capacitor to charge the capacitor to a threshold level over an adjustable time period;

generating a first trigger circuit when the capacitor is charged to the threshold level;

generating a second trigger signal in response to the first trigger signal;

supplying a first voltage substantially equal to the first supply voltage to the electrical load in response to the second trigger signal;

generating a third trigger signal in response to the second trigger signal; and supplying a second voltage substantially equal to second supply voltage to a second electrical load in response to the third trigger signal.

29. The method of claim 28, wherein the condition is fluid flow in a conduit, and the step of detecting is performed by a reed switch in the conduit.

30. The method of claim 28, wherein the step of providing a first supply voltage is performed by supplying an alternating current voltage, and rectifying the alternating current voltage.

31. The method of claim 28, wherein the step of generating a first trigger signal is performed by a DIAC.

32. The method of claim 28, wherein the step of generating a second trigger signal is performed by a silicon-controlled rectifier.

33. The method of claim 28, wherein the step of supplying a first voltage substantially equal to the first supply voltage is performed by a first TRIAC which receives the second trigger signal at a gate.

34. The method of claim 28, wherein the adjustable time period is between 0 and 90 seconds and wherein the adjustable time period may be adjusted by a variable resistor.

35. The method of claim 34, wherein the variable resistor may be bypassed by trim pot jumper to adjust the adjustable time period to 0 seconds.

36. The method of claim 28, wherein the electrical load is an alarm circuit.

37. The method of claim 28, wherein the step of generating a third trigger signal is performed by an opto-TRIAC.

38. The method of claim 28, wherein the step of supplying a second voltage is performed by a second TRIAC.

39. The method of claim 28, wherein the second electrical load is electrically isolated from the electrical load.

* * * * *